United States Patent [19]
Goff

[11] Patent Number: 6,114,910
[45] Date of Patent: Sep. 5, 2000

[54] TEMPERATURE COMPENSATED AMPLIFIER AND OPERATING METHOD

[75] Inventor: Miles E. Goff, Carlisle, Mass.

[73] Assignee: Raytheon Company, Lexington, Mass.

[21] Appl. No.: 09/211,119

[22] Filed: Dec. 14, 1998

[51] Int. Cl.[7] .......................................................... H03F 1/30
[52] U.S. Cl. ............................................ 330/289; 330/133
[58] Field of Search ............................... 330/86, 133, 282, 330/289

[56] References Cited

U.S. PATENT DOCUMENTS

| | | | |
|---|---|---|---|
| 4,400,796 | 8/1983 | Closson et al. .......................... | 330/256 |
| 5,099,204 | 3/1992 | Wheatley, III ........................... | 330/279 |
| 5,159,288 | 10/1992 | Ito .......................................... | 330/289 |
| 5,216,384 | 6/1993 | Vanhecke ................................. | 330/133 |
| 5,268,601 | 12/1993 | Cossins .................................... | 330/289 |
| 5,576,662 | 11/1996 | Price et al. ............................... | 330/289 |

*Primary Examiner*—Robert Pascal
*Assistant Examiner*—Khanh Van Nguyen
*Attorney, Agent, or Firm*—Fish & Richardson P.C.

[57] ABSTRACT

An amplifier having an uncompensated gain which decreases with increasing temperature. The amplifier includes an integrated circuit chip having formed thereon a plurality of serially coupled amplifier stages. Each one of a portion of such stages has temperature compensation circuitry. Such circuitry includes a plurality of selectable gains, such gain being selected in accordance with temperature of the chip. The stage has a higher gain at a temperature above a predetermined threshold level associated with such stage and a lower gain at temperature below such predetermined threshold level associated with such stage. Each one of such stages is associated with a different predetermined threshold level. Each one of the stages includes a gain stage having a switchable feedback element, such stage providing a first gain when such element is switched into one state and a second gain when such element is switched into a second state. The temperature compensation circuitry switches such element into one of the states selectively in accordance with the temperature of the chip. Each one of the stages includes a gain stage having: a feedback element; and a switch, such element being in shunt with the switch. The switch is operable to either shunt such element or un-shunt such element. The stage provides a first gain when such element is shunted by the switch and a second gain when such element is un-shunted by such switch. The temperature compensation circuitry places such switch is a condition to either shunt such element or un-shunt such element selectively in accordance with the temperature of the chip.

16 Claims, 7 Drawing Sheets

Gain Error in Temperature Compensated Circuit

TEMPERATURE COMPENSATED AMPLIFIER AND OPERATING METHOD

BACKGROUND OF THE INVENTION

This invention relates generally to amplifiers and more particularly to temperature compensated amplifiers.

As is known in the art, amplifiers are used in a wide variety of applications. For example, modern wireless communication products such as cellular telephones, satellite receivers and pagers require amplifiers to boost very weak signals that enter from the antenna to levels useable in subsequent receiver processing circuits. Amplifiers are used in transmitters as well, raising the power level emanating from message modulation circuits to that suitable for long range transmission.

As is also known in the art, one problem with many amplifiers is that their electrical characteristics change, and in particular their gain level, changes with ambient temperature. In many applications, some sort of temperature compensation is required to allow sensible operation without saturation. Several temperature compensation techniques have been suggested. One technique used is to change the operating current of the transistors used in the amplifier in accordance with the temperature. This technique, while inexpensive, is not very desirable when linearity and noise figure are important because, by the time the operating current is changed enough to change the gain the noise figure and linearity have been compromised.

Another more complex technique is to install a variable attenuator in the amplifier chain of plurality of serially coupled amplifier stages and change its attenuation in accordance with temperature. While this technique is more costly than the above described technique, better results can be obtained since the amplifier stages maintain a more constant noise figure and saturation level. Further, more than one attenuator is sometimes needed to keep the operating power levels in the entire amplifier chain within reasonable limits over the operating temperature range. Besides the cost of the additional attenuators, more amplifier stages must be added to overcome the insertion loss of the attenuators. Further, tracking problems arise when an amplifier stage yields more or less gain than predicted due to manufacturing variations, which then means an attenuator in the same amplifier chain is set to the wrong level for proper system operation.

A still more complex technique, used in expensive systems, is to use digitally programmed attenuators. The settings for these attenuators are individually determined at the time of manufacture by means of measuring the system performance over temperature and determining what settings are necessary for proper system operation. Sometimes even the frequency of operation is needed as well. All this information is stored in a digital programmable memory (PROM) and later used by a digital processor with its inputs of ambient temperature and frequency of operation and other system variables to determine the proper attenuator setting for system operation.

SUMMARY OF THE INVENTION

In accordance with the present invention, an amplifier is provided wherein a plurality of serially coupled amplifier stages is formed on an integrated circuit chip. Each one of such stages has temperature compensation circuitry comprising a gain selector for providing such stage with a discrete gain in accordance with the temperature of the chip.

In accordance with another feature of the invention, an amplifier is provided wherein a plurality of serially coupled amplifier stages is formed on an integrated circuit chip adapted to operate over a range in temperature. Each one of the stages has temperature compensation circuitry comprising a gain selector for providing such stage with a change in gain in accordance with a different operating temperature of the chip.

In accordance with another feature of the invention, each one of the stages includes a gain stage having a switchable element, such stage providing a first gain when such element is switched into one state and a second gain when such element is switched into a second state. The temperature compensation circuitry switches such element into one of the states selectively in accordance with the temperature of the chip.

In accordance with another feature of the invention, each one of the stages includes a gain stage having: a feedback element; and a switch, such element being in shunt with the switch. The switch is operable to either shunt such element or un-shunt such element. The stage provides a first gain when such element is shunted by the switch and a second gain when such element is un-shunted by such switch. The temperature compensation circuitry places such switch is a condition to either shunt such element or un-shunt such element selectively in accordance with the temperature of the chip.

In accordance with another feature of the invention, an amplifier having an uncompensated gain which decreases with increasing temperature is compensated with a temperature compensation circuit. An integrated circuit chip is provided having formed thereon a plurality of serially coupled amplifier stages. Each one of a portion of such stages has associated with in a gain selector for providing such stage with a discrete change in gain in accordance with temperature of the chip. The stage has a higher gain at a temperature above a predetermined threshold level associated with such stage and a lower gain at temperature below such predetermined threshold level associated with such stage. Each one of such stages is associated with a different predetermined threshold level.

In accordance with another feature of the invention, a temperature sensing circuit is provided for measuring temperature of the chip over a range of temperatures and for producing a temperature signal representative of the measured temperature. A control section is provided having a plurality of comparators. Each one of the comparators is fed by the temperature signal and a different threshold signal. Each one of the threshold signals represents a different temperature in the range of temperatures. Each one of the comparators produces the control signal for a corresponding one of the amplifier stages.

With the distributed nature of the temperature compensation scheme, performance of the overall amplifier chain will not change much from room temperature since the changes that occur on a stage to stage basis are small and are distributed over the entire amplifier chain.

In accordance with another feature of the invention, a method is provided for operating an amplifier. An integrated circuit chip is provided having formed thereon: a plurality of serially coupled amplifier stages, each one of such stages having temperature compensation circuitry; and a gain selector for providing such stage with a discrete change in gain in accordance with the temperature of the chip. The temperature of the chip is measured. The gain provided by the gain selector is changed in accordance with the temperature of the chip.

BRIEF DESCRIPTION OF THE DRAWING

These and other features of the invention, as well as the invention itself, will become more readily apparent from the following detailed description when taken together with the accompanying drawings, in which.

DESCRIPTION OF THE PREFERRED EMBODIMENTS

Figure 1:
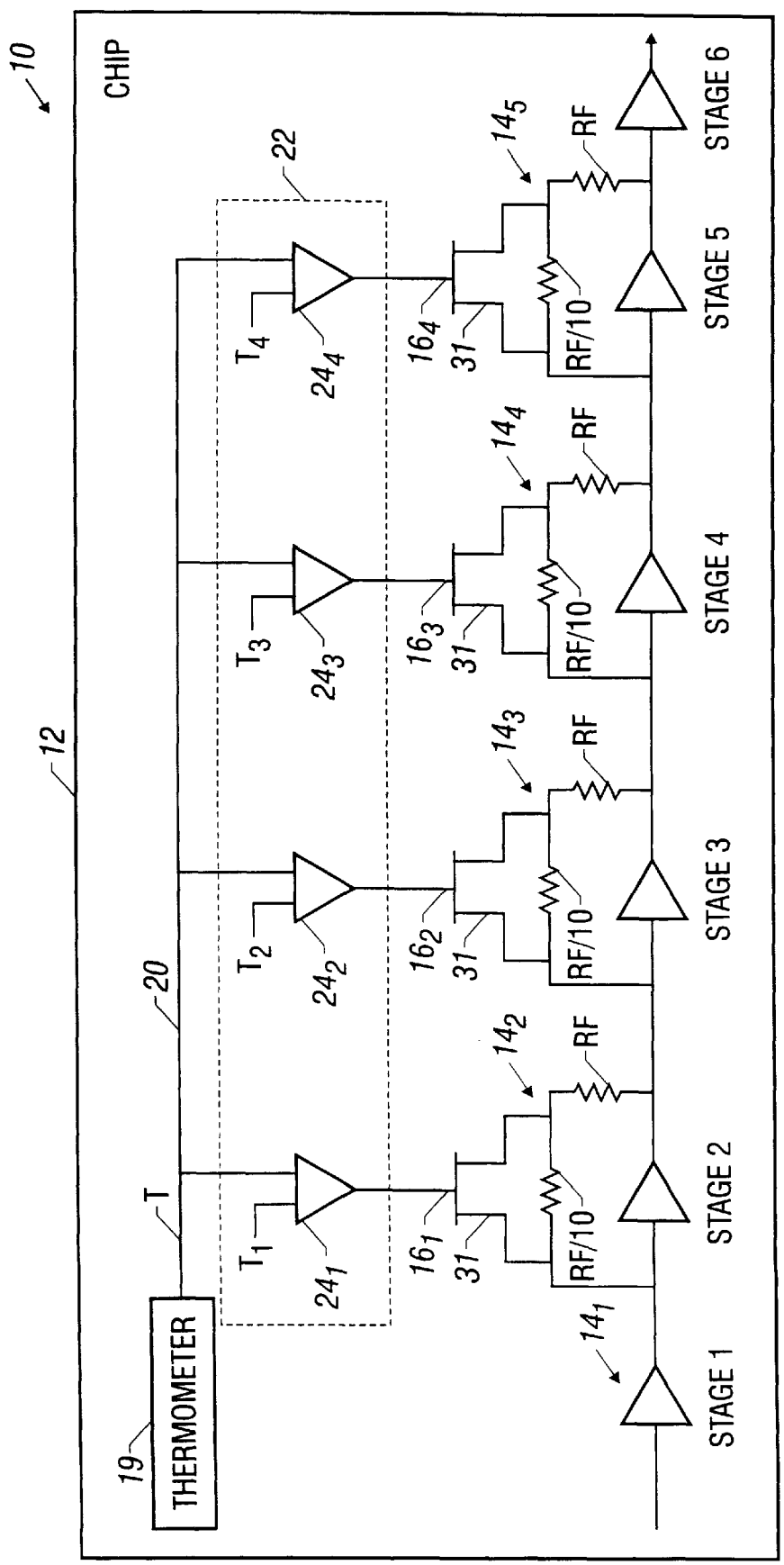
FIG. 1 is a block diagram of a temperature compensated amplifier according to the invention.
Figure 1A:
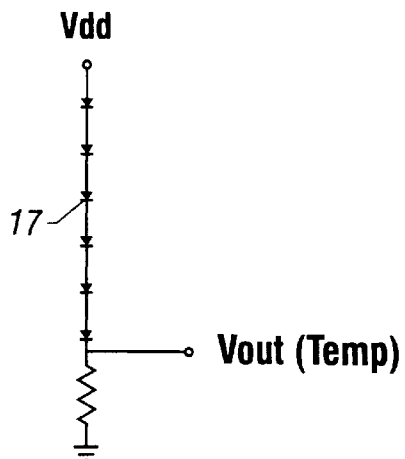
FIG. 1A is a schematic diagram of a thermometer adapted for use in the amplifier of FIG. 1.
Figure 1B:
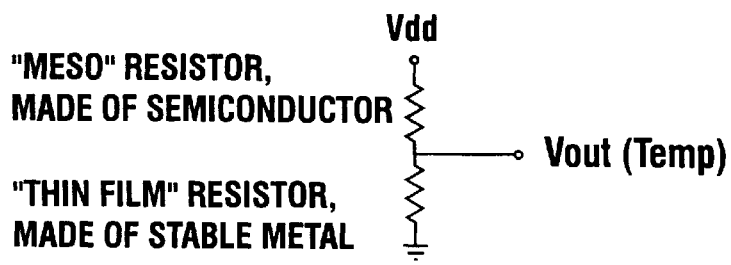
FIG. 1B is a schematic diagram of another thermometer adapted for use in the amplifier of FIG. 1.

Referring now to FIG. 1, a temperature compensated amplifier 10 is shown. The amplifier 10 is formed on a semiconductor, here silicon or gallium arsenide, for example, integrated circuit chip 12 and includes a plurality of, here for example, six, serially coupled amplifier stages $14_1$–$14_6$. Here, the amplifier 10 includes a first stage $14_1$ (stage 1) optimized for noise figure and a last stage $14_6$ (stage 6) optimized for power output and efficiency. Each one of the remaining portion of such stages $14_2$–$14_5$ (i.e., stages 2, 3, 4 and 5) has a gain selected in accordance with a control signal fed to such stage on lines $16_1$–$16_4$, respectively, as shown. A temperature sensing circuit 17, i.e. a thermometer such as serially connected diodes, as shown in FIG. 1A, is provided for measuring temperature of the chip 12 over a range of temperatures, here from $-10°$ C. to $+60°$ C. and for producing a temperature signal, T, on line 20 representative of the measured temperature. The amplifier 10 includes a control section 22 comprising a plurality of comparators $24_1$–$24_4$. Each one of the comparators $24_1$–$24_4$, for example, a Schmitt trigger, is fed by the fed temperature signal, T, on line 20, and a different temperature threshold signal, $T_1$–$T_4$, respectively, as shown. Each one of the temperature threshold signals, $T_1$–$T_4$, represents a different temperature in the range of temperatures. Each one of the comparators $24_1$–$24_4$ produces the control signal for a corresponding one of the portion of amplifier stages $14_2$–$14_5$ on a corresponding one of the lines $16_1$–$16_4$, respectively, as shown.

Figure 2:
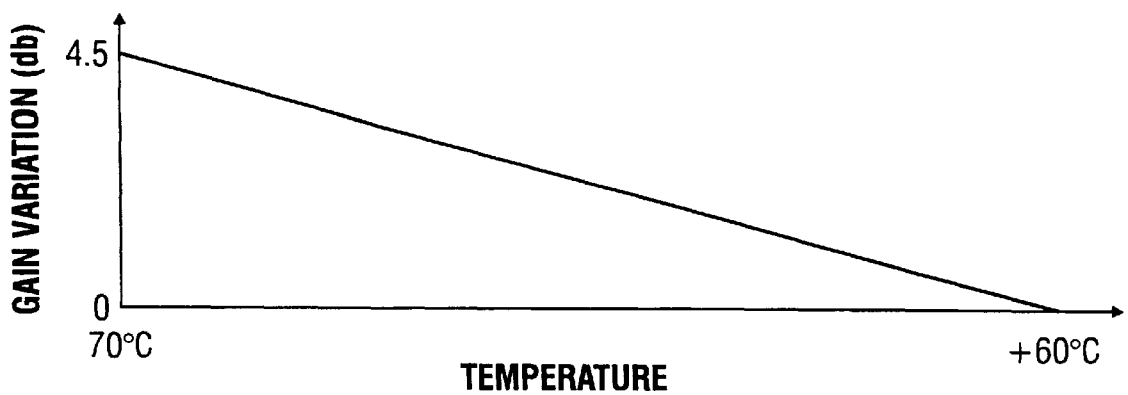
FIG. 2 is a plot of gain variation vs. temperature of the amplifier of FIG. 1 without gain compensation as a function of temperature according to the invention.
Figure 3A:
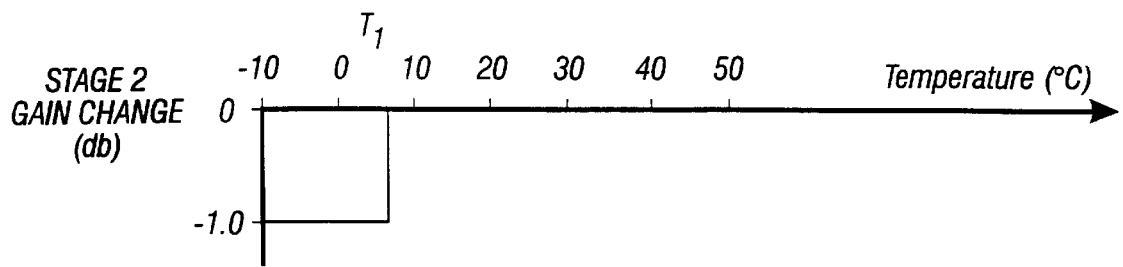
FIGS. 3A through 3D are curves showing the relation between the gain change in each of a plurality of gain stages in the amplifier of FIG. 1 as a function of temperature measured by the thermometer of FIG. 1A or FIG. 1B.
Figure 3B:
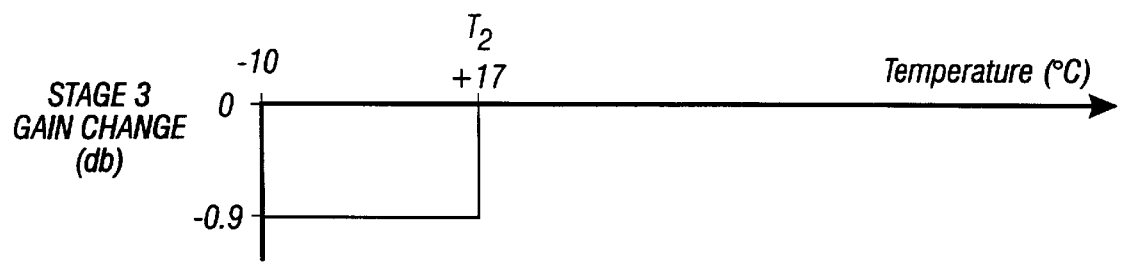
Figure 3C:
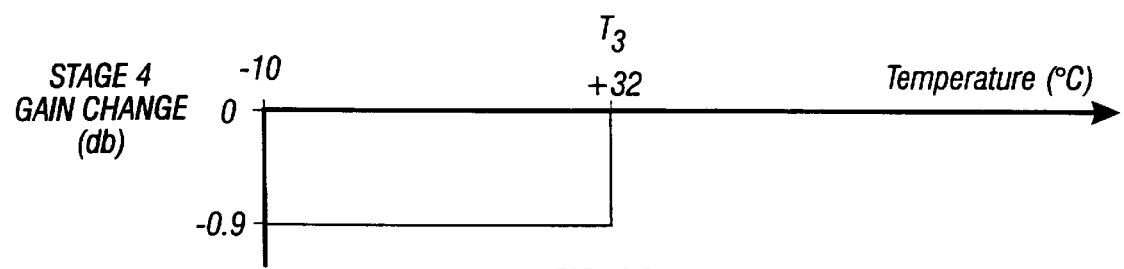
Figure 3D:
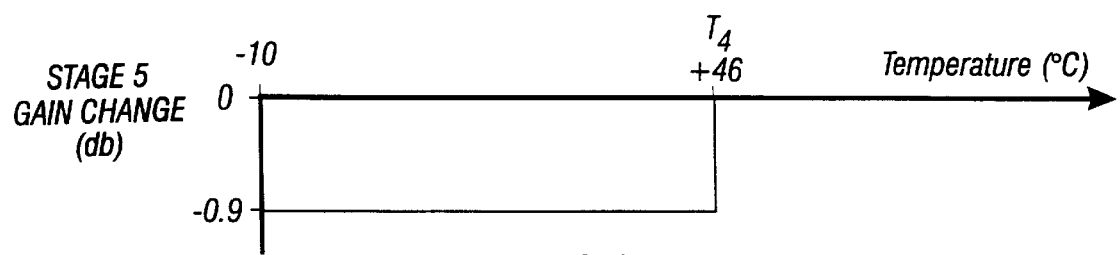

More particularly, here, if left uncompensated by the control section 22, the gain variation of the amplifier 10 would decease with temperature as, for example, shown in FIG. 2. Thus, it is noted that the gain of the amplifier 10 here changes $-4.5$ db over an operating range of temperatures from $-10°$ C. to $+60°$ C. In order to compensate for this gain variation, the gain of each one of the four stages $14_2$–$14_5$, (FIG. 1) is changed by $-0.9$ db over uniformly over the operating temperature range. Referring to FIGS. 3A through 3D, here the gain of stage $14_2$ (stage 2) is changed by $-0.9$ db at a threshold temperature, $T_1$, of $+3°$ C., the gain of stage $14_3$ (stage 3) is changed by $-0.9$ db at a threshold temperature, $T_2$, of $+17°$ C., the gain of stage $14_4$ (stage 4) is changed by $-0.9$ db at a threshold temperature, $T_3$, of $+32°$ C. and the gain of stage $14_5$, (stage 5) is changed at a threshold temperature, $T_4$, of $+46°$ C. More particularly, these gains are increased as the temperature increases above the threshold temperatures $T_1$–$T_4$ and the gain is reduced as the temperature is reduced below the threshold temperatures $T_1$–$T_4$, as shown in FIGS. 3A–3D.

Figure 4:
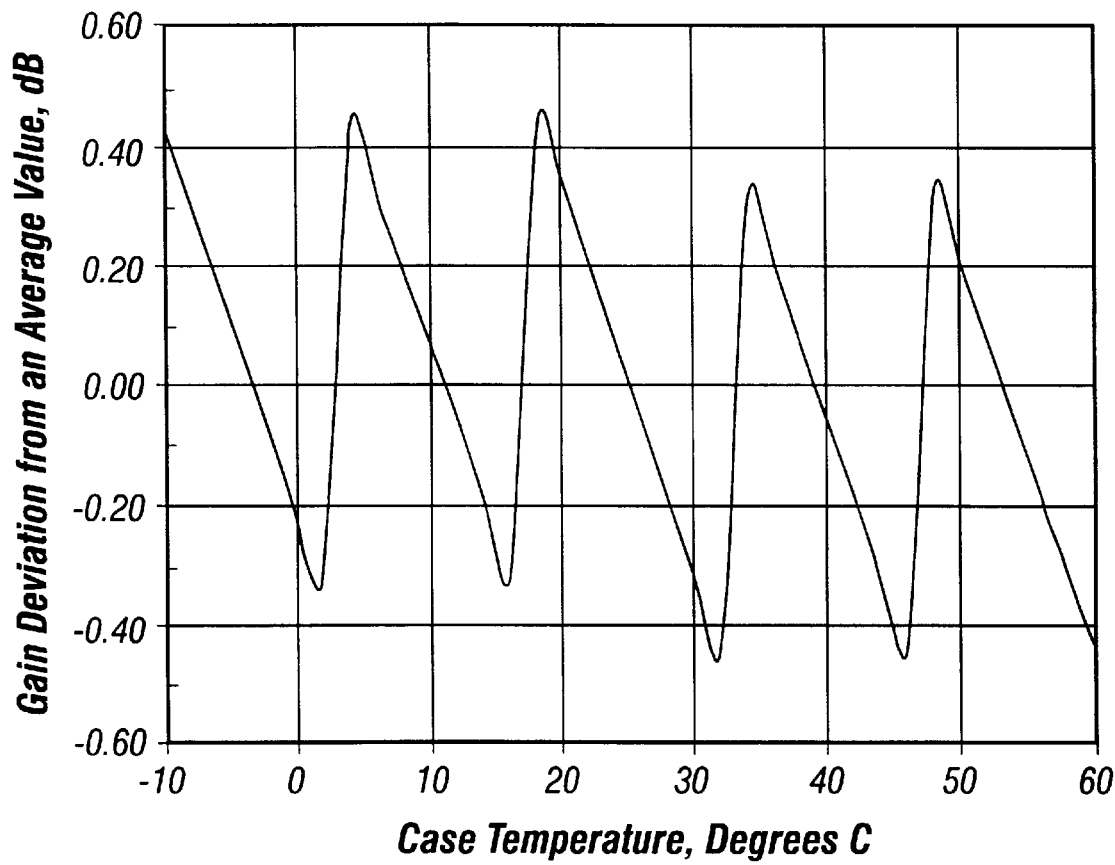
FIG. 4 is a curve showing gain variation of the amplifier of FIG. 1 as a function of temperature measured by the thermometer of FIG. 1A or FIG. 1B.

Referring to FIG. 4, the overall gain variation from an average value over the operating temperature range is shown with a total variation within $\pm 0.5$ db. It is noted that the gain variation in the compensated amplifier is inversely proportional to the number of stages switched according to the following relationship:

Per Stage Compensated Gain Variation =Total Gain Variation/ (Number of Stages +1)

In the example above, as noted from FIG. 4, each stage $14_2$–$14_5$ provides 0.9 db peak to peak or 0.45 db peak gain variation.

Figure 5:
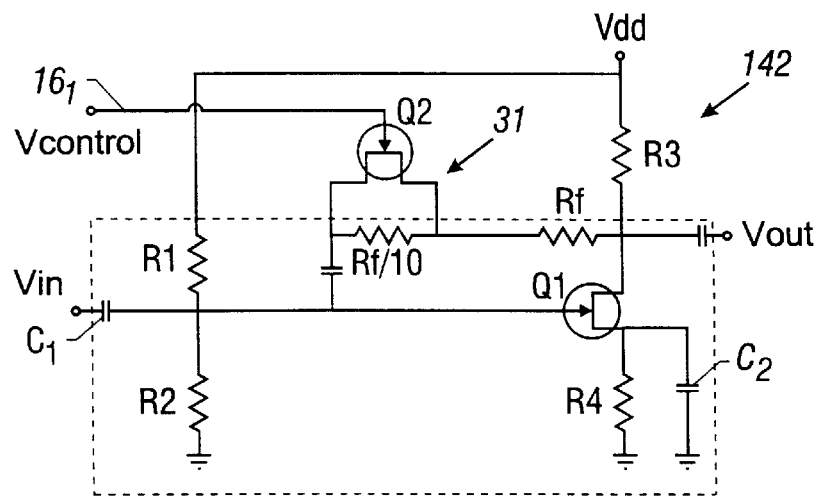
FIG. 5 is a schematic diagram of an exemplary of on the gain stages of the amplifier of FIG. 1.

Referring in more detail to FIG. 1, each one of the stages $14_2$–$14_5$ is identical in construction. An exemplary one thereof, here stage $14_2$ being shown in detail in FIG. 5. It is first noted that such gain stage 142 includes a gain element, here a transistor Q1 and biasing resistors $R_1$–$R_4$, dc blocking capacitors C1 and C2, and a pair of serially connected feedback resistors Rf/10 and Rf. As is known, the gain of the gain element is proportional to the feedback resistance. It is noted that here one of the resistors in the feedback, here the resistor Rf/10 has a switch 31 connected in shunt across its terminals. The switch 31 is here a field effect transistor (FET) Q2. The gate of the FET Q2 is fed by the control signal on line $16_1$. When the temperature T is move than $T_1$, the switch 31 is open and the resistor Rf/10 is not shunted so that the total resistance in the feedback is Rf+(Rf/10). When the temperature T is less than T, the switch is closed so that the total resistance in the feedback is Rf or 10 percent less. Thus, the gain of stage $14_2$ is 0.9 db lower at temperatures less than $T_1$ than at temperatures move than $T_1$.

Figure 6:
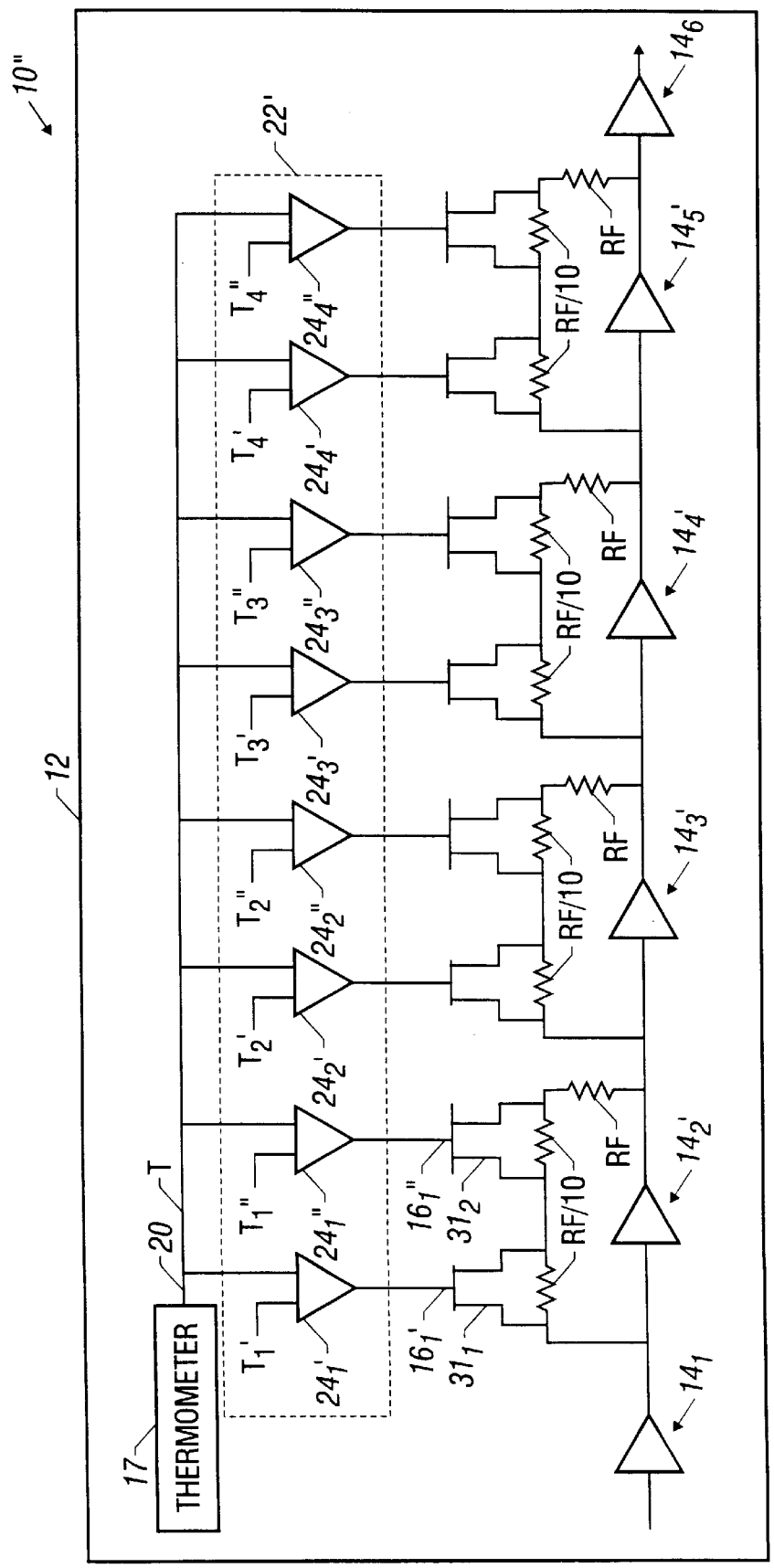
FIG. 6 is a schematic diagram of another embodiment of a temperature compensated amplifier according to the invention.

Referring now to FIG. 6, a temperature compensated amplifier 10' is shown wherein each stage $14'_2$–$14'_5$ of the amplifier 10 has more than two gain states, here three gain states, to be described. The control section 22' includes four pairs of comparators: $24'_1$, $24''_1$; $24'_2$, $24''_2$; $24'_3$, $24''_3$; and $24'_4$, $24''_4$, as shown. Each of the four pairs of comparators operates in a similar manner. Thus, considering comparator $24'_1$, such comparator $24'_1$ is fed by the signal on line 20 representative of the temperature T and a signal representative of a first threshold temperature, $T'_1$. The output of comparator $24_1'$ produces a control signal on line $16'_1$, as shown. Comparator $24''_1$ is fed by the signal on line 20 representative of the temperature T and a signal representative of a second threshold temperature, $T''_1$. The output of comparator $24''_1$ produces a control signal on line $16''_1$, as shown.

Figure 7A:
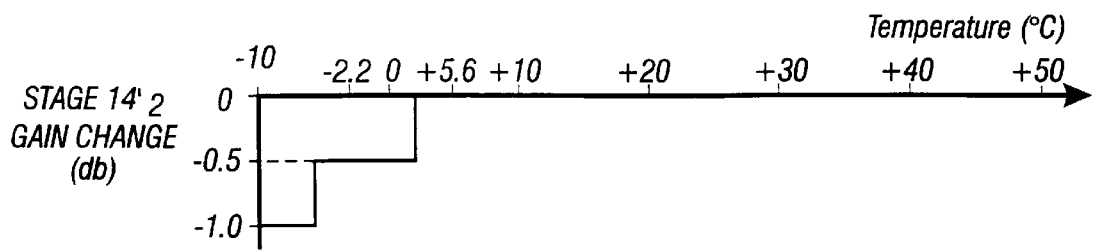
FIGS. 7A–7D are curves showing the relation between the gain change in each of a plurality of gain stages in the amplifier of FIG. 6 as a function of temperature measured by the thermometer of FIG. 1A or FIG. 1B.
Figure 7B:
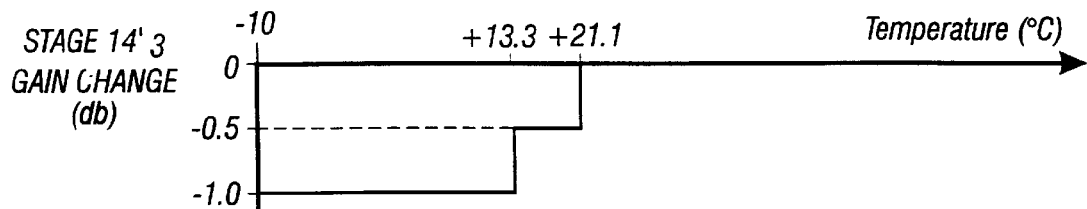
Figure 7C:
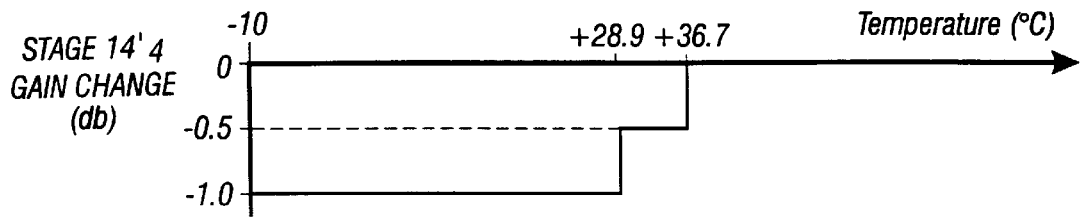
Figure 7D:
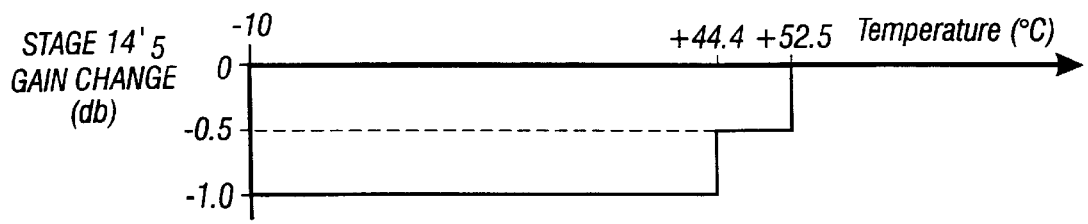
Figure 8:
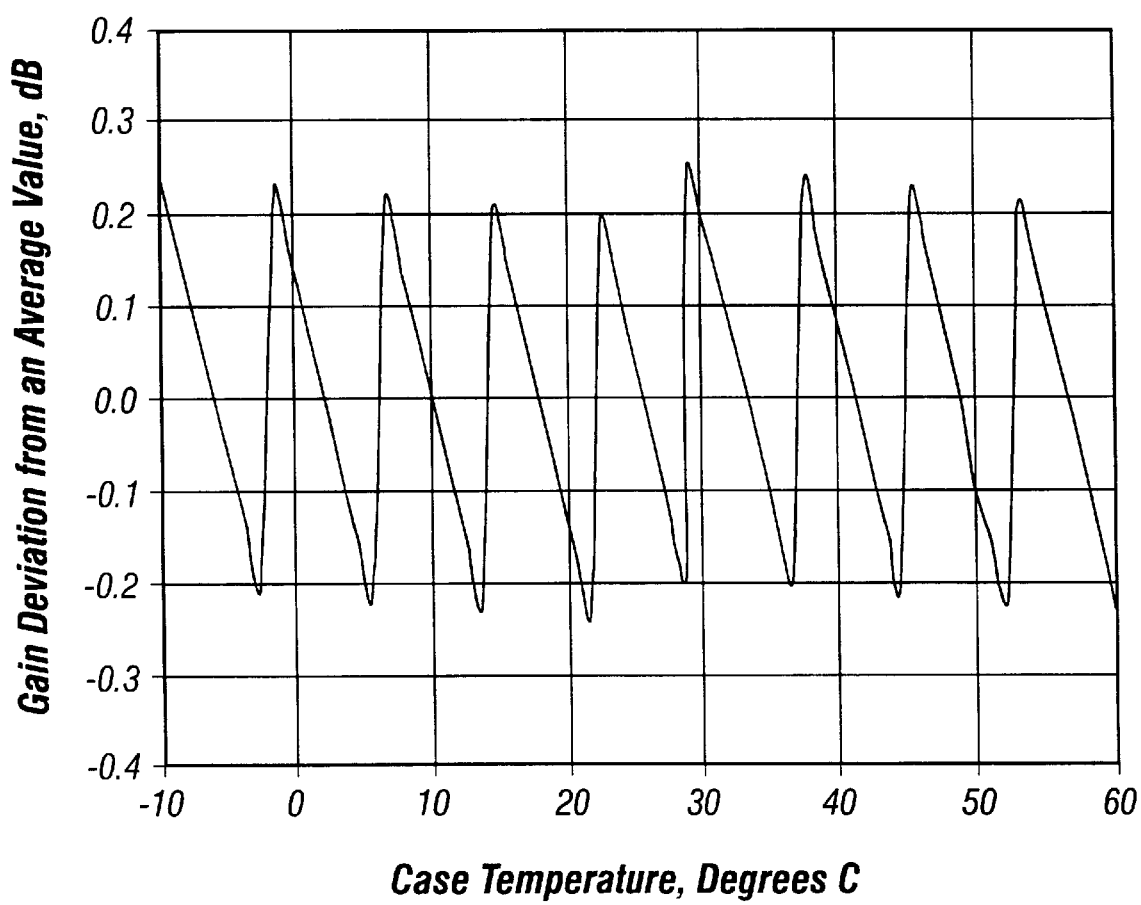
FIG. 8 is a curve showing gain variation of the amplifier of FIG. 6 as a function of temperature measured by the thermometer of FIG. 1A or FIG. 1B.

More particularly, referring to FIGS. 7A–7D, as the ambient temperature increases, the gain of stage $14_2$ (stage 2) as shown in FIG. 7A is changed by $-0.5$ db at a threshold temperature $T''_1$ of $+5.2°$ C. Thus, stage $14_2$ (stage 2) has either a 0 db gain state, (no gain change), a +0.5 db gain compensated state, or a +1.0 db gain compensated state, as indicated. In like manner, the gain of stage $14'_3$ (stage 3) is changed by +0.5 db at a threshold temperature, $T'_2$ of +13.3° C., and again by +0.5 db at a threshold temperature, $T''_2$, of +21.1° C., as shown in FIG. 7B; the gain of stage $14'_4$ (stage 4) is changed by +0.5 db at a threshold temperature, $T'_3$, of +28.9° C. and again by +0.5 db at a threshold temperature, $T'''_3$ of +36.7° C., as shown in FIG. 7C; and, the gain of stage $14'_5$ (stage 5) is changed by +0.5 db at a threshold temperature, $T'_4$, of +44.4° C. and again by +0.5 db at a threshold temperature, $T''_4$ of +52.5° C., as shown in FIG. 7D. More particularly, these gains are increased as the temperature increases above the threshold temperatures $T'_{1-T''4}$ and the gain is decreased as the temperature is reduced below the threshold temperatures $T'_{1-T''4}$, as shown in FIGS. 7A–7D. The overall gain error is shown in FIG. 8 where less than 0.5 db peak to peak is demonstrated. It is noted that under these conditions, the compensated gain variation is given by:

Compensated Gain Variation=Total Gain Variation/(Number of Gain States)

It is noted that while the two switches per stage used in the amplifier 10 (FIG. 6) could provide four gain states per stage with the use of a digital coder, here such digital coder is not used and, as noted above, the switching points using different temperatures for each level sensor (i.e., comparator) as before, is shown below:

| Switch State | Temperature | Gain Level |
|---|---|---|
| None "On" | Hot | Highest |
| One "On" | Warm | Normal |
| Both "On" | Cold | Lowest |

If further reduction in the compensated gain variation is required, it is only necessary to increase the number of gain states, by increasing the number of gain stages with switches, or increasing the number of switches in a gain stage, or some combination thereof.

Other embodiments are within the spirit and scope of the appended claims. For example, a digital coder may be used to obtain more gain states at a moderate increase in complexity. Further, the chip may have on it different types of amplifiers, so that a radio frequency (RF) amplifier an intermediate frequency (IF) amplifier and baseband amplifiers on the same chip as would be found in a receiver, for example, may be compensated together with a common thermometer. Thus, only one wire representing the temperature being sensed need be threaded through the receiver stage by stage. The switching points of the comparators should be chosen carefully and controlled in production to ensure the operation of the entire scheme. The thermometer should be very repeatable on a unit to unit basis. The system using this temperature compensation scheme should be tolerant of small gain changes occurring over a relatively small temperature range.

What is claimed is:

1. An amplifier, comprising:
   an integrated circuit chip having formed thereon:
      a plurality of serially coupled amplifier stages, each one of such stages having temperature compensation circuitry comprising a gain selector for providing such stage with a discrete change in gain in accordance with the temperature of the chip.

2. An amplifier, comprising:
   an integrated circuit chip adapted to operate over a range in temperature, such chip having formed thereon:
      a plurality of serially coupled amplifier stages, each one such stages having temperature compensation circuitry comprising a gain selector for providing such stage with a discrete change in gain in accordance with a different operating temperature of the chip.

3. The amplifier recited in claim 2 wherein each one of the stages includes a gain stage having a switchable element, such stage providing a first gain when such element is switched into one state and a second gain when such element is switched into a second state, and wherein such temperature compensation circuitry switches such element into one of the states selectively in accordance with the temperature of the chip.

4. The amplifier recited in claim 2 wherein each one of the stages includes a gain stage having: a feedback element; and a switch, such element being in shunt with the switch, such switch being operable to either shunt such element or un-shunt such element, such stage providing a first gain when such element is shunted by the switch and a second gain when such element is un-shunted by such switch, and wherein such temperature compensation circuitry places such switch is a condition to either shunt such element or un-shunt such element selectively in accordance with the temperature of the chip.

5. An amplifier having an uncompensated gain which decreases with increasing temperature, comprising:
   an integrated circuit chip having formed thereon:
      a plurality of serially coupled amplifier stages, each one of a portion of such stages having temperature compensation circuitry comprising a gain selector for providing such stage with a discrete change in gain in accordance with temperature of the chip, such stage having a higher gain at a temperature above a predetermined threshold temperature associated with such stage and a lower gain at temperature below such predetermined threshold temperature associated with such stage, each one of such stages being associated with a different predetermined threshold temperature.

6. An amplifier having an uncompensated gain which decreases with increasing temperature, comprising:
   an integrated circuit chip having formed thereon:
      a plurality of serially coupled amplifier stages, each one of a portion of such stages having temperature compensation circuitry comprising:
         a plurality of selectable gains, such gain being selected in accordance with temperature of the chip, such stage having a higher gain at a temperature above a predetermined threshold temperature associated with such stage and a lower gain at temperature below such predetermined threshold level associated with such stage, each one of such stages being associated with a different predetermined threshold temperature.

7. The amplifier recited in claim 6 wherein each one of the stages includes a gain stage having a switchable element, such stage providing a first gain when such element is switched into one state and a second gain when such element is switched into a second state, and wherein such temperature compensation circuitry switches such element into one of the states selectively in accordance with the temperature of the chip.

8. The amplifier recited in claim 6 wherein each one of the stages includes a gain stage having: a feedback element; and a switch, such element being in shunt with the switch, such switch being operable to either shunt such element or un-shunt such element, such stage providing a first gain when such element is shunted by the switch and a second gain when such element is un-shunted by such switch, and wherein such temperature compensation circuitry places such switch is a condition to either shunt such element or un-shunt such element selectively in accordance with the temperature of the chip.

9. A temperature compensated amplifier, comprising:
   an integrated circuit chip having formed thereon:
      a plurality of serially coupled amplifier stages, each one of a portion of such stages having a plurality of selectable discrete gains, such gain being selected in accordance with a control signal fed to such stage;
      a temperature sensing circuit for measuring temperature of the chip over a range of temperatures and for producing a temperature signal representative of the measured temperature;
      a control section comprising a plurality of comparators, each one fed by the fed temperature signal and a different threshold signal, each one of the threshold signals representing a different temperature in the range of temperatures, each one of the comparators producing the control signal for a corresponding one of the portion of the amplifier stages.

10. The amplifier recited in claim 9 wherein each one of the stages includes a gain stage having a switchable element, such stage providing a first gain when such element is switched into one state and a second gain when such element is switched into a second state, and wherein such temperature compensation circuitry switches such element into one of the states selectively in accordance with the temperature of the chip.

11. The amplifier recited in claim 9 wherein each one of the stages includes a gain stage having: a feedback element; and a switch, such element being in shunt with the switch, such switch being operable to either shunt such element or un-shunt such element, such stage providing a first gain when such element is shunted by the switch and a second gain when such element is un-shunted by such switch, and wherein such temperature compensation circuitry places such switch is a condition to either shunt such element or un-shunt such element selectively in accordance with the temperature of the chip.

12. A method for operating an amplifier, comprising:
   providing an integrated circuit chip having formed thereon: a plurality of serially coupled amplifier stages, each one of such stages having temperature compensation circuitry; and a gain selector for providing such stage with a discrete change in gain in accordance with the temperature of the chip;
   measuring the temperature of the chip; and
   changing the gain provided by the gain selector in accordance with the temperature of the chip.

13. A method for operating an amplifier, comprising:
   providing an integrated circuit chip adapted to operate over a range in temperature, such chip having formed thereon: a plurality of serially coupled amplifier stages, each one such stages having temperature compensation circuitry comprising a gain selector for providing such stage with a discrete change in gain in accordance with a different operating temperature of the chip;
   measuring the temperature of the chip; and
   changing the gain provided by the gain selector in accordance with the temperature of the chip.

14. The method amplifier recited in claim 13 wherein each one of the stages includes a gain stage having a switchable element, such stage providing a first gain when such element is switched into one state and a second gain when such element is switched into a second state, including the step of:
   operating such temperature compensation circuitry switches selectively in accordance with the temperature of the chip.

15. The amplifier recited in claim 13 wherein each one of the stages is provided with a gain stage having: a feedback element; and a switch, such element being in shunt with the switch; and
   operating such switch to either shunt such element or un-shunt such element, such stage providing a first gain when such element is shunted by the switch and a second gain when such element is un-shunted by such switch, and wherein such temperature compensation circuitry places such switch is a condition to either shunt such element or un-shunt such element selectively in accordance with the temperature of the chip.

16. A method for operating an amplifier having an uncompensated gain which decreases with increasing temperature, comprising:
   providing an integrated circuit chip having formed thereon: a plurality of serially coupled amplifier stages, each one of a portion of such stages having temperature compensation circuitry comprising a gain selector for providing such stage with a discrete change in gain in accordance with temperature of the chip, such stage having a higher gain at a temperature above a predetermined threshold temperature associated with such stage and a lower gain at temperature below such predetermined threshold temperature associated with such stage, each one of such stages being associated with a different predetermined threshold temperature;
   measuring the temperature of the chip; and
   changing the gain provided by the gain selector in accordance with the temperature of the chip.

* * * * *